(12) United States Patent
Theivendran et al.

(10) Patent No.: US 11,870,466 B2
(45) Date of Patent: *Jan. 9, 2024

(54) BARREL COMPACTOR SYSTEM, METHOD AND DEVICE

(71) Applicant: Marvell Asia PTE, LTD, Singapore (SG)

(72) Inventors: Premshanth Theivendran, Foster City, CA (US); Weihuang Wang, Los Gatos, CA (US); Sowmya Hotha, Cupertino, CA (US); Srinath Atluri, Fremont, CA (US)

(73) Assignee: Marvell Asia PTE, LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/868,657

(22) Filed: Jul. 19, 2022

(65) Prior Publication Data

US 2022/0368344 A1  Nov. 17, 2022

Related U.S. Application Data

(63) Continuation of application No. 16/786,608, filed on Feb. 10, 2020, now Pat. No. 11,424,759, which is a continuation of application No. 15/917,284, filed on Mar. 9, 2018, now Pat. No. 10,581,455, which is a continuation of application No. 14/675,728, filed on Mar. 31, 2015, now Pat. No. 9,954,551.

(51) Int. Cl.
*H03M 7/30* (2006.01)

(52) U.S. Cl.
CPC ....... *H03M 7/3059* (2013.01); *H03M 7/6011* (2013.01)

(58) Field of Classification Search
CPC .... H03M 7/3059; H03M 7/55; H03M 7/6011; H03M 7/305; H03M 7/601; H03M 69/32; H04L 69/22; H04L 69/324; H04L 29/08; H04L 29/06; H04L 45/46; H04L 45/50
See application file for complete search history.

(56) References Cited

U.S. PATENT DOCUMENTS

| | | |
|---|---|---|
| 5,650,734 A | 7/1997 | Chu |
| 6,691,214 B1 | 2/2004 | Li |
| 6,901,489 B2 | 5/2005 | Gruner |
| 7,486,110 B2 | 2/2009 | Bhatti |
| 8,300,714 B2 * | 10/2012 | Yun ..................... H04L 27/2618 370/242 |
| 2004/0196706 A1 | 10/2004 | Matsumoto |
| 2005/0235148 A1 | 10/2005 | Scheidt |
| 2008/0259796 A1 | 10/2008 | Abousleman |
| 2011/0246955 A1 * | 10/2011 | Ohtsuka ................ G06F 30/394 716/112 |
| 2012/0019286 A1 | 1/2012 | Salhany |
| 2013/0022083 A1 * | 1/2013 | Vasseur ............... H04L 12/4035 375/132 |

(Continued)

*Primary Examiner* — Wei Zhao

(57) ABSTRACT

A packet processing system having a barrel compactor that extracts a desired data subset from an input dataset (e.g. an incoming packet). The barrel compactor is able to selectively shift one or more of the input data units of the input dataset based on individual shift values for those data units. Additionally, in some embodiments one or more of the data units are able to be logically combined to produce a desired logical output unit.

55 Claims, 5 Drawing Sheets

(56) References Cited

U.S. PATENT DOCUMENTS

| | | |
|---|---|---|
| 2013/0170435 A1 | 7/2013 | Dinan |
| 2014/0056577 A1 | 2/2014 | Ogawa |
| 2016/0294988 A1 | 10/2016 | Theivendran |

* cited by examiner

BARREL COMPACTOR SYSTEM, METHOD AND DEVICE

RELATED APPLICATIONS

This application is a continuation of U.S. application Ser. No. 16/786,608, filed on Feb. 10, 2020, and entitled "A BARREL COMPACTOR SYSTEM, METHOD AND DEVICE," which is a continuation of U.S. application Ser. No. 15/917,284, filed on Mar. 9, 2018, and entitled "A BARREL COMPACTOR SYSTEM, METHOD AND DEVICE," which is a continuation of U.S. application Ser. No. 14/675,728, filed on Mar. 31, 2015, and entitled "A BARREL COMPACTOR SYSTEM, METHOD AND DEVICE," all of which are hereby incorporated by reference.

FIELD OF INVENTION

The present invention relates to data extraction. More particularly, the present invention relates to a barrel compactor for extracting a desired subset from an input dataset.

BACKGROUND OF THE INVENTION

Data processing devices, such as data packet-processing devices like a switch microchip, generally operate by inputting data, parsing the input data, processing of the data, extracting desired portions of the data and ultimately outputting of desired portions of the data. In particular, the data extraction process is traditionally performed utilizing large multiplexers that each receive all of the input data and output the desired portions of the data. However, these large multiplexors that are capable of receiving and multiplexing between such large quantities of input data are very expensive. As a result, the data processing devices utilizing such large multiplexors as extraction elements are correspondingly expensive.

BRIEF SUMMARY OF THE INVENTION

A packet processing system having a barrel compactor that extracts a desired data subset from an input dataset (e.g. an incoming packet). The barrel compactor is able to selectively shift one or more of the input data units of the input dataset based on individual shift values for those data units. Additionally, in some embodiments one or more of the data units are able to be logically combined to produce a desired logical output unit.

A first aspect is directed to a barrel compactor system for extracting a subset of data from a plurality of data units that together form an input dataset. The system comprises a data unit shift generator that generates an independent shift value for each of the data units within the subset of the input dataset, wherein the independent shift value indicates a number of positions within the input dataset to shift the associated data unit and a barrel compactor comprising a plurality of logic cells arranged in an array, wherein the barrel compactor receives the input dataset, and shifts one or more of the data units of the subset based on the independent shift values such that the subset is in a different position within the input dataset. In some embodiments, when in the different position within the input dataset, all of the data units of the subset are adjacent to each other. In some embodiments, when in the different position within the input dataset, a rightmost data unit of the subset is in a rightmost position of the input dataset or a leftmost data unit of the subset is in a leftmost position of the input dataset. In some embodiments, the array comprises a plurality of rows and a column for each of the plurality of data units of the input dataset, wherein the logic cells of each of the columns are coupled together in series by a plurality of data pass lines. In some embodiments, for one or more of the rows of one or more of the columns, each of the logic cells of the one or more rows of the one or more columns is coupled with the logic cell of the next row of a different one of the columns via a data shift line. In some embodiments, the different one of the columns is a predetermined number of columns away from the column including the logic cell of the one or more rows of the one or more columns. In some embodiments, the predetermined number of columns away is the same for all of the logic cells in the same one of the rows.

In some embodiments, the barrel compactor receives the input dataset by inputting a different one of the data units with each of the columns such that the input dataset is received by the array in parallel, and further wherein each of the independent shift values is transmitted through the array along with the associated one of the data units. In some embodiments, upon receiving one of the data units and the associated independent shift value from either one of the shift lines or one of the pass lines during a cycle, each of the logic cells transmit the data unit and the associated independent shift value down one of the pass lines to the next logic cell of the column if the independent shift value does not indicate a shift is necessary by the row that the logic cell is a part of and transmit the data unit and the associated independent shift value to the logic cell of the next row of the different one of the columns via the data shift line if the independent shift value indicates that a shift is necessary by the row that the logic cell is a part of In some embodiments, the system further comprises a data subset identifier that generates a qualifier value for each of the data units of the input dataset. In some embodiments, the qualifier value indicates if the data unit is a part of the subset, wherein each of the qualifier values is transmitted through the array along with the associated one of the data units. In some embodiments, upon receiving both one of the data units and the associated independent shift value from one of the shift lines and one of the data units and the associated independent shift value from one of the pass lines during the same cycle, each of the logic cells discard the one of the data units and the associated independent shift value from the one of the pass lines and select the one of the data units and the associated independent shift value from the one of the shift lines for transmission based on the associated independent shift value.

In some embodiments, upon receiving both one of the data units, the associated independent shift value and the associated qualifier value from one of the shift lines and one of the data units, the associated independent shift value and the associated qualifier value from one of the pass lines during the same cycle, each of the logic cells discard the one of the data units, the associated independent shift value and the associated qualifier value from the one of the pass lines if the associated qualifier value from the one of the pass lines indicates that the one of the data units from the one of the pass lines is not a part of the subset, discard the one of the data units, the associated independent shift value and the associated qualifier value from the one of the shift lines if the associated qualifier value from the one of the shift lines indicates that the one of the data units from the one of the shift lines is not a part of the subset, if the associated qualifier value from the one of the pass lines indicates that the one of the data units from the one of the pass lines is a part of the subset, select the one of the data units, the associated independent shift value and the associated qualifier value from the one of the pass lines for transmission based on the associated independent shift value from the one of the pass lines and if the associated qualifier value from the one of the shift lines indicates that the one of the data units from the one of the shift lines is a part of the subset, select the one of the data units, the associated independent shift value and the associated qualifier value from the one of the shift lines for transmission based on the associated independent shift value from the one of the shift lines.

In some embodiments, the data shift unit generator inserts a zero in a location between one or more of the data units of the subset as organized in the different position by reducing the independent shift values of all of the data units to either the right or the left of the location by one. In some embodiments, each of the logic cells comprise a multiplexor. In some embodiments, the data unit shift generator generates the independent shift value for each of the data units of the subset based on the qualifier values of the plurality of data units. In some embodiments, the data unit shift generator generates the independent shift value for each of the data units of the subset based on the qualifier values of the plurality of data units by using the qualifier values to identify the data units that are a part of the subset, calculating a first number of the data units that are between one side of the input dataset and a closest one of the data units of the subset to the one side and for each gap between one of the data units of the subset and a next of the data units of the subset, calculating a gap size that is equal to a number of the data units within the gap. In some embodiments, the data unit shift generator determines the independent shift value of each of the data units of the subset by summing the first number and the gap size of each of the gaps between the data unit and the one side of the input dataset. In some embodiments, each of the data units is selected from the group consisting of a bit, a byte or a word. In some embodiments, for each of the rows of the array, each of the independent shift values indicate whether a shift is necessary for the row.

A second aspect is directed to a barrel compactor for extracting a subset of data from a plurality of data units that together form an input dataset, the barrel compactor comprising a plurality of logic cells arranged in an array, wherein the barrel compactor receives the input dataset, and shifts one or more of the data units of the subset such that the subset is in a different position within the input dataset, wherein each of the data units of the subset have a corresponding independent shift value that indicates a number of positions within the input dataset to shift the associated data unit, and further wherein the barrel compactor shifts the one or more of the data units of the subset based on the independent shift values. In some embodiments, when in the different position within the input dataset, all of the data units of the subset are adjacent to each other. In some embodiments, when in the different position within the input dataset, a rightmost data unit of the subset is in a rightmost position of the input dataset or a leftmost data unit of the subset is in a leftmost position of the input dataset. In some embodiments, the array comprises a plurality of rows and a column for each of the plurality of data units of the input dataset, wherein the logic cells of each of the columns are coupled together in series by a plurality of data pass lines. In some embodiments, for one or more of the rows of one or more of the columns, each of the logic cells of the one or more rows of the one or more columns is coupled with the logic cell of the next row of a different one of the columns via a data shift line.

In some embodiments, the different one of the columns is a predetermined number of columns away from the column including the logic cell of the one or more rows of the one or more columns. In some embodiments, the predetermined number of columns away is the same for all of the logic cells in the same one of the rows. In some embodiments, the barrel compactor receives the input dataset by inputting a different one of the data units with each of the columns such that the input dataset is received by the array in parallel, and further wherein each of the independent shift values is transmitted through the array by the logic cells along with the associated one of the data units. In some embodiments, upon receiving one of the data units and the associated independent shift value from either one of the shift lines or one of the pass lines during a cycle, each of the logic cells transmit the data unit and the associated independent shift value down one of the pass lines to the next logic cell of the column if the independent shift value does not indicate a shift is necessary by the row that the logic cell is a part of and transmit the data unit and the associated independent shift value to the logic cell of the next row of the different one of the columns via the data shift line if the independent shift value indicates that a shift is necessary by the row that the logic cell is a part of. In some embodiments, each of the data units of the input dataset have a qualifier value that indicates if the data unit is a part of the subset. In some embodiments, each of the qualifier values is transmitted by the logic cells through the array along with the associated one of the data units. In some embodiments, upon receiving both one of the data units and the associated independent shift value from one of the shift lines and one of the data units and the associated independent shift value from one of the pass lines during the same cycle, each of the logic cells discard the one of the data units and the associated independent shift value from the one of the pass lines and select the one of the data units and the associated independent shift value from the one of the shift lines for transmission based on the associated independent shift value.

In some embodiments, upon receiving both one of the data units, the associated independent shift value and the associated qualifier value from one of the shift lines and one of the data units, the associated independent shift value and the associated qualifier value from one of the pass lines during the same cycle, each of the logic cells discard the one of the data units, the associated independent shift value and the associated qualifier value from the one of the pass lines if the associated qualifier value from the one of the pass lines indicates that the one of the data units from the one of the pass lines is not a part of the subset, discard the one of the data units, the associated independent shift value and the associated qualifier value from the one of the shift lines if the associated qualifier value from the one of the shift lines indicates that the one of the data units from the one of the shift lines is not a part of the subset, if the associated qualifier value from the one of the pass lines indicates that the one of the data units from the one of the pass lines is a part of the subset, select the one of the data units, the associated independent shift value and the associated qualifier value from the one of the pass lines for transmission based on the associated independent shift value from the one of the pass lines and if the associated qualifier value from the one of the shift lines indicates that the one of the data units from the one of the shift lines is a part of the subset, select the one of the data units, the associated independent shift value and the associated qualifier value from the one of the shift lines for transmission based on the associated independent shift value from the one of the shift lines.

In some embodiments, the barrel compactor inserts a zero in a location between one or more of the data units of the subset as organized in the different position by reducing the independent shift values of all of the data units to either the right or the left of the location by one. In some embodiments, each of the logic cells comprise a multiplexor. In some embodiments, the barrel compactor generates the independent shift value for each of the data units of the subset based on the qualifier values of the plurality of data units. In some embodiments, the barrel compactor generates the independent shift value for each of the data units of the subset based on the qualifier values of the plurality of data units by using the qualifier values to identify the data units that are a part of the subset, calculating a first number of the data units that are between one side of the input dataset and a closest one of the data units of the subset to the one side and for each gap between one of the data units of the subset and a next of the data units of the subset, calculating a gap size that is equal to a number of the data units within the gap. In some embodiments, the barrel compactor determines the independent shift value of each of the data units of the subset by summing the first number and the gap size of each of the gaps between the data unit and the one side of the input dataset. In some embodiments, each of the data units is selected from the group consisting of a bit, a byte or a word. In some embodiments, for each of the rows of the array, each of the independent shift values indicate whether a shift is necessary for the row.

A third aspect is directed to a method of extracting a subset of data from a plurality of data units that together form an input dataset. The method comprises receiving the input dataset with a barrel compactor comprising a plurality of logic cells arranged in an array and shifting one or more of the data units of the subset with the barrel compactor such that the subset is in a different position within the input dataset, wherein each of the data units of the subset have a corresponding independent shift value that indicates a number of positions within the input dataset to shift the associated data unit, and further wherein the barrel compactor shifts the one or more of the data units of the subset based on the independent shift values. In some embodiments, when in the different position within the input dataset, all of the data units of the subset are adjacent to each other. In some embodiments, when in the different position within the input dataset, a rightmost data unit of the subset is in a rightmost position of the input dataset or a leftmost data unit of the subset is in a leftmost position of the input dataset. In some embodiments, the array comprises a plurality of rows and a column for each of the plurality of data units of the input dataset, wherein the logic cells of each of the columns are coupled together in series by a plurality of data pass lines. In some embodiments, for one or more of the rows of one or more of the columns, each of the logic cells of the one or more rows of the one or more columns is coupled with the logic cell of the next row of a different one of the columns via a data shift line. In some embodiments, the different one of the columns is a predetermined number of columns away from the column including the logic cell of the one or more rows of the one or more columns. In some embodiments, the predetermined number of columns away is the same for all of the logic cells in the same one of the rows.

In some embodiments, the barrel compactor receives the input dataset by inputting a different one of the data units with each of the columns such that the input dataset is received by the array in parallel, and further wherein each of the independent shift values is transmitted through the array by the logic cells along with the associated one of the data units. In some embodiments, the method further comprises, for each of the logic cells, upon receiving one of the data units and the associated independent shift value from either one of the shift lines or one of the pass lines during a cycle transmitting with the logic cell the data unit and the associated independent shift value down one of the pass lines to the next logic cell of the column if the independent shift value does not indicate a shift is necessary by the row that the logic cell is a part of and transmitting with the logic cell the data unit and the associated independent shift value to the logic cell of the next row of the different one of the columns via the data shift line if the independent shift value indicates that a shift is necessary by the row that the logic cell is a part of. In some embodiments, each of the data units of the input dataset have a qualifier value that indicates if the data unit is a part of the subset. In some embodiments, each of the qualifier values is transmitted by the logic cells through the array along with the associated one of the data units. In some embodiments, the method further comprises, with each of the logic cells, upon receiving both one of the data units and the associated independent shift value from one of the shift lines and one of the data units and the associated independent shift value from one of the pass lines during the same cycle discarding with the logic cell the one of the data units and the associated independent shift value from the one of the pass lines and selecting with the logic cell the one of the data units and the associated independent shift value from the one of the shift lines for transmission based on the associated independent shift value.

In some embodiments, the method further comprises, for each of the logic cells, upon receiving both one of the data units, the associated independent shift value and the associated qualifier value from one of the shift lines and one of the data units, the associated independent shift value and the associated qualifier value from one of the pass lines during the same cycle discarding with the logic cell the one of the data units, the associated independent shift value and the associated qualifier value from the one of the pass lines if the associated qualifier value from the one of the pass lines indicates that the one of the data units from the one of the pass lines is not a part of the subset, discarding with the logic cell the one of the data units, the associated independent shift value and the associated qualifier value from the one of the shift lines if the associated qualifier value from the one of the shift lines indicates that the one of the data units from the one of the shift lines is not a part of the subset, if the associated qualifier value from the one of the pass lines indicates that the one of the data units from the one of the pass lines is a part of the subset, selecting with the logic cell the one of the data units, the associated independent shift value and the associated qualifier value from the one of the pass lines for transmission based on the associated independent shift value from the one of the pass lines and if the associated qualifier value from the one of the shift lines indicates that the one of the data units from the one of the shift lines is a part of the subset, selecting with the logic cell the one of the data units, the associated independent shift value and the associated qualifier value from the one of the shift lines for transmission based on the associated independent shift value from the one of the shift lines.

In some embodiments, the method further comprises inserting with the barrel compactor a zero in a location between one or more of the data units of the subset as organized in the different position by reducing the independent shift values of all of the data units to either the right or the left of the location by one. In some embodiments, each of the logic cells comprise a multiplexor. In some embodiments, the method further comprises generating the independent shift value for each of the data units of the subset with the barrel compactor based on the qualifier values of the plurality of data units. In some embodiments, the barrel compactor generates the independent shift value for each of the data units of the subset based on the qualifier values of the plurality of data units by using the qualifier values to identify the data units that are a part of the subset, calculating a first number of the data units that are between one side of the input dataset and a closest one of the data units of the subset to the one side and for each gap between one of the data units of the subset and a next of the data units of the subset, calculating a gap size that is equal to a number of the data units within the gap. In some embodiments, the barrel compactor determines the independent shift value of each of the data units of the subset by summing the first number and the gap size of each of the gaps between the data unit and the one side of the input dataset. In some embodiments, each of the data units is selected from the group consisting of a bit, a byte or a word. In some embodiments, for each of the rows of the array, each of the independent shift values indicate whether a shift is necessary for the row.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Embodiments are directed to a packet processing system having a barrel compactor that extracts a desired data subset from an input dataset (e.g. an incoming packet). The barrel compactor is able to selectively shift one or more of the input data units of the input dataset based on individual shift values for those data units. Additionally, in some embodiments one or more of the data units are able to be logically combined to produce a desired logical output unit. Accordingly, the desired subset of the input dataset is able to be shifted to a desired location within the input dataset such that the subset can be easily extracted as a continuous set of extracted data. As a result, the system provides the advantage of minimizing the cost of data extraction by eliminating the need for high cost wide multiplexors.

Figure 1:
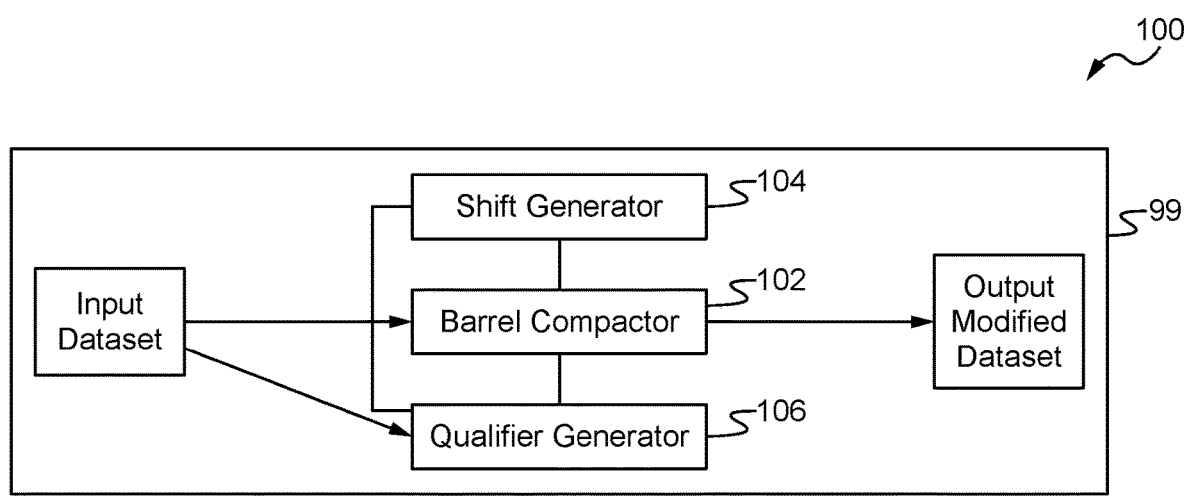
FIG. 1 illustrates a packet processing system on a packet processing device according to some embodiments.

FIG. 1 illustrates a packet processing system 100 on a packet processing device 99 according to some embodiments. As shown in FIG. 1, the system 100 comprises a barrel compactor 102, a shift generator 104 and a qualifier generator 106 communicatively coupled together via one or more networks (e.g. buses/interfaces). Specifically, the shift generator 104 and the qualifier generator 106 are coupled to each other and to the barrel compactor 102. Alternatively, the shift generator 104 is able to be incorporated into the barrel compactor 102 such that the barrel compactor is able to perform the functions of the shift generator 104 as described herein. In some embodiments, the shift generator 104 and the qualifier generator 106 are able to be incorporated into a single element. Alternatively, the shift generator 104 and the qualifier generator 106 are able to be separate elements. The packet processing device 99 is able to be a packet processing circuit, microchip and/or a die. For example, the device 99 is able to be a switch microchip (e.g. top of rack switch) for a data center or other type of packet processing circuit or application specific integrated circuit. In some embodiments, the device 99 is a software defined network programmable microchip that is able to be programmed or customized to adjust the manner in which packets are processed. Alternatively, the device 99 is able to be other types of data (e.g. data packet) processing devices known in the art. The network is able to comprise a plurality of wide or narrow interfaces or buses that wired and/or wirelessly communicatively couple together the components of the system 100 for transmitting data and/or control signals between the components. The barrel compactor 102, shift generator 104 and/or qualifier generator 106 are each able to comprise hardware, software or a combination of hardware and software configured to perform the corresponding functions described herein, wherein the software is stored on a non-transitory computer readable medium of the device 99.

In operation, an input dataset is received and input by one or more of the barrel compactor 102 and/or the qualifier generator 106. Based on the input dataset, the qualifier generator 106 generates one or more qualifier values that identify a subset of the input data that needs to be extracted. For example, the qualifier generator 106 is able to identify an incoming packet or packets and assign qualifier values to one or more of the data units of the incoming data indicating that those data units need to be extracted (i.e. are a part of the desired subset of the input dataset). The shift generator 104 is able to receive these qualifier values and/or the input dataset and generate shift values for one or more of the data units of the dataset that indicate to the barrel compactor how much each of the data units need to be shifted in order to be extracted from the remainder of the input dataset. For example, the shift generator 104 is able to generate shift values for each of the data units of the dataset whose qualifier values indicate that they are a part of the desired subset. Indeed, the shift values are able to be selected such that after the data units of the subset are shifted the subset will form a single group (e.g. all be adjacent to each other) within the dataset.

The value of each of the shift values is able to be based on the qualifier values and/or the relative position of each of the data units within the input dataset. In particular, the shift values are able to be selected based on one or more gaps of data units that are not a part of the subset (e.g. have qualifier values that indicate that they are not a part of the desired subset) that are in between two or more data units of the subset or between an end position within the dataset and the subset. For example, for each data unit of the desired subset, the shift generator 104 is able to determining the size (e.g. number of data units) of all of the gaps between that data unit and an end of the dataset where the subset is being shifted to. The value of that summation of the size of all of those gaps is equal to the number of positions that the data unit will need to be shifted and thus is able to determine the corresponding shift value for the data units. Accordingly, once this has been performed for all of the data units of the subset, the shift generator 104 is able to generate shift values for all of the subset that will result in elimination of the gaps in the modified output dataset such that the subset forms an adjacent group of data units. Alternatively, the shift values are able to be otherwise determined by the shift generator 104 based on the input dataset and/or qualifier values.

The shift generator 104 transmits these shift values and qualifier values to the barrel compactor 102 such that along with the input dataset, each of the data units of the dataset received by the barrel compactor 102 have a corresponding shift value and a corresponding qualifier value. In some embodiments, instead of receiving the input dataset directly, the barrel compactor 102 receives the input dataset from the shift generator 104 and/or qualifier generator 106. In some embodiments, instead of from the qualifier generator 106 directly, the barrel compactor 102 receives the qualifier values from the qualifier generator 106 via the shift generator 104. The barrel compactor 102, upon receiving the dataset, the shift values and/or the qualifier values, is able to shift and otherwise process each of the data units of the dataset (including the corresponding shift value and qualifier value) in parallel. In particular, the barrel compactor 102 shifts the data units of the input dataset such that all of the data units of the subset are positioned in an adjacent group within the input dataset (e.g. on the far right or far left positions of the input dataset) thereby forming a modified output dataset that is output by the barrel compactor 102. As a result, the system 100 is able to provide the advantage of extracting the desired subset into a single group within the input dataset such that the subset is able to be easily removed and used for further processing.

In some embodiments, the barrel compactor 102 is able to logically combine/modify one or more of the data units of the subset according to predetermined logical functions when the shifting and/or qualifier values indicate that such a function should be performed on pairs of the data units of the subset. As a result, in such embodiments the system 100 provides the advantage of selectively performing desired combinatorial logic with one or more pairs of the data units and/or results from prior combinations of data units thereby providing increased processing power in addition to the data extraction. Additionally, in some embodiments the barrel compactor 102 is able to insert one or more zeros (or data units whose value is equal to zero) into the subset such that when the subset is positioned into the adjacent group within the modified output dataset one or more zeros will be added to the subset in between desired portions of the subset. As a result, in such embodiments the system 100 provides the advantage of enabling portions of the subset to be distinguished from each other (e.g. a buffer between a flag and a remainder of the subset) while still grouping the subset as a whole into an adjacent group (including the added zeros) within the modified output dataset.

In some embodiments, the input dataset comprises one or more packets and the associated packet data (e.g. a packet header, a packet body). Alternatively, the input dataset is able to comprise other types of data and/or data formats or signals wherein a subset of the data is able to be extracted from the input dataset. In some embodiments, each data unit of the input dataset is a bit. Alternatively, the data units are able to be bits, bytes, words, files and/or other groups or sizes of data. In other words, the granularity of the data units is able to be a small as a single bit and as large as any number or organization of a plurality of bits (e.g. bytes, words, files).

Figure 2:
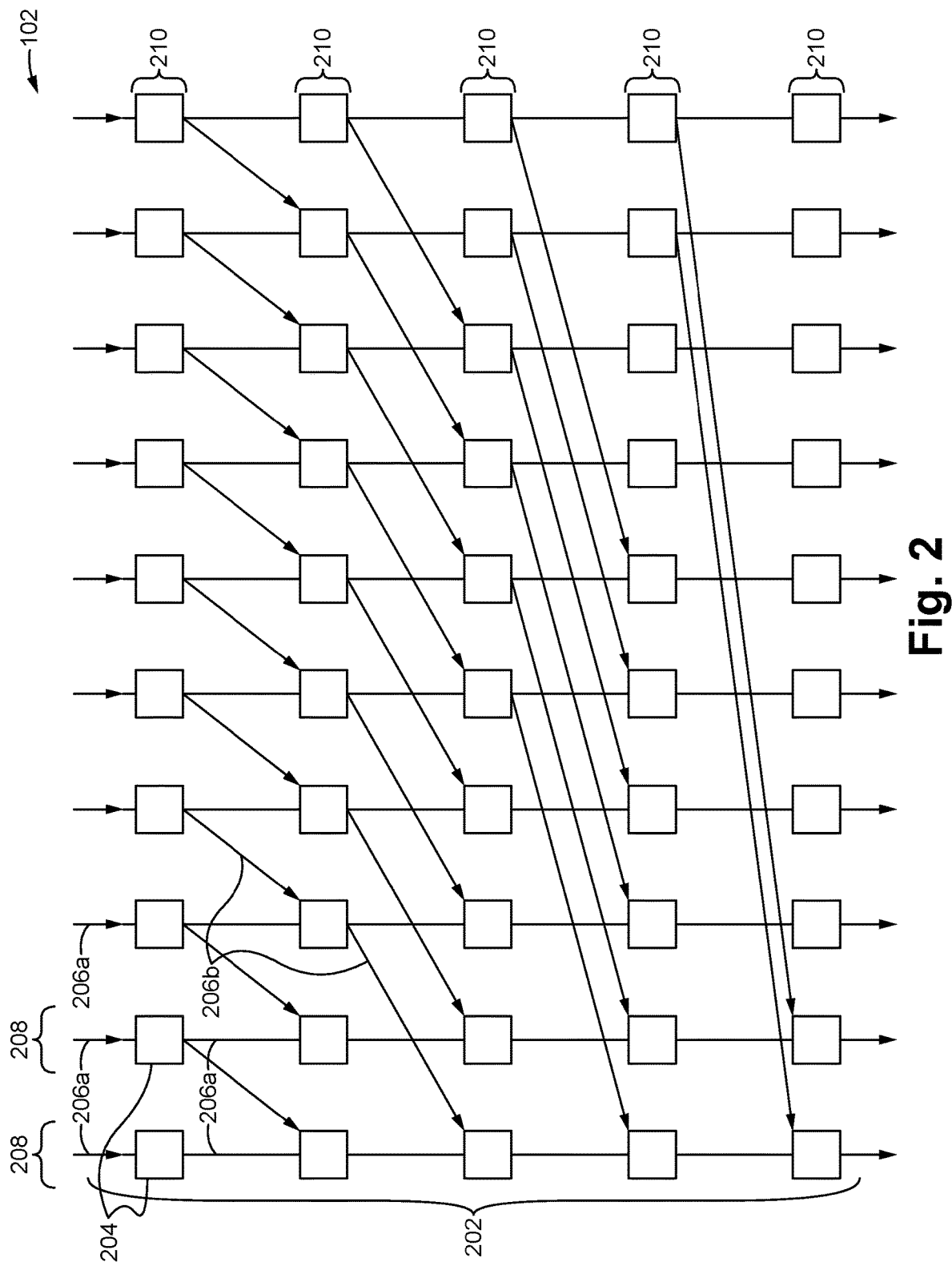
FIG. 2 illustrates a barrel compactor according to some embodiments.

FIG. 2 illustrates a barrel compactor 102 according to some embodiments. As shown in FIG. 2, the barrel compactor 102 comprises an array or grid 202 of logic cells 204 including a plurality of columns 208 and a plurality of rows 210. Each of the logic cells 204 of a column 208 are coupled together in series by a plurality of unidirectional pass lines or buses 206a. As a result, each logic cell 204 of a column 208 is able to input a data unit (and the corresponding shift value and/or qualifier value) via an incoming input pass line 206a and output the data unit (and the corresponding shift value and/or qualifier value) via an outgoing pass line 206a. Additionally, one or more of logic cells 204 of each row 210 (except for the last row) are additionally coupled to a logic cell 204 in a different column 208 of the next row 210 via a unidirectional shift bus or line 206b. As a result, one or more of the logic cells 204 are able to input one or two data units (and the corresponding shift values and/or qualifier values) from either an incoming input pass line 206a, an incoming shift line 206b or both. Similarly, one or more of the logic cells 204 are able to output the one or a selected one of the two data units, or a logical combination of the two data units (and the corresponding shift values and/or qualifier values) on either an outgoing pass line 206a or an outgoing shift line 206b.

Specifically, as described in detail below, each of the logic cells 204 is able to output a received data unit (and the corresponding shift value and/or qualifier value) on the outgoing pass line 206a unless the corresponding shift value indicates that the logic cell 204 should output the data unit via the outgoing shift line 206b thereby shifting the data unit (and the corresponding shift value and/or qualifier value). Further, as described in detail below, if two data units are received during the same cycle on the incoming pass line 206a and the incoming shift line 206b, the logic cell 204 is able to choose one and discard the other or logically combine the two based on the corresponding qualifier values and/or data of the pair of data units. For example, in some embodiments the logic cell 204 always discards the data unit from the incoming pass line 206a and selects the data unit from the incoming shift line 206b. Indeed, in such embodiments the qualifier values are able to be omitted and/or not passed along with the corresponding data units through the array 202. Alternatively, if one of the data units is a part of the subset and the other one of the data units is not a part of the subset (e.g. as indicated by the corresponding qualifier values), the logic cell 204 is able to discard the data unit that is not a part of the subset and select the data unit that is a part of the subset. Moreover, in some embodiments if both of the data units are a part of the subset (e.g. as indicated by the corresponding qualifier values), the logic cell 204 is able to perform a predetermined logical function that combines the data of the two data units (thereby creating a single modified data units). In such embodiments, the logic cell 204 is able to select one of the shift values and qualifier to send along with the modified data unit or is able to combine the shift values into a modified shift value to be sent along with the modified data unit and the selected qualifier value.

Although as shown in FIG. 2, the array 202 comprises ten columns 208 by five rows 210 of logic cells 204 where each of the shift lines 206b shift to the left, any number of columns 208 and/or rows 210 having shift lines 206b that all shift to the right or all shift to the left are contemplated. As shown in FIG. 2, the rows 210 shift one, two, four and eight columns/positions respectively in binary increasing order (e.g. 1, 2, 4, 8, 16 . . . ). Alternatively, each of the rows 210 are able to shift more or less columns/positions and/or be in a different shifting order (e.g. decreasing order, random order, any other order). As shown in FIG. 2, all of the cells 204 of each of the rows 210 shift the same amount. Alternatively, in some embodiments one or more of the logic cells 204 within one or more of the same rows 210 are able to shift a differing amounts.

Figure 3:
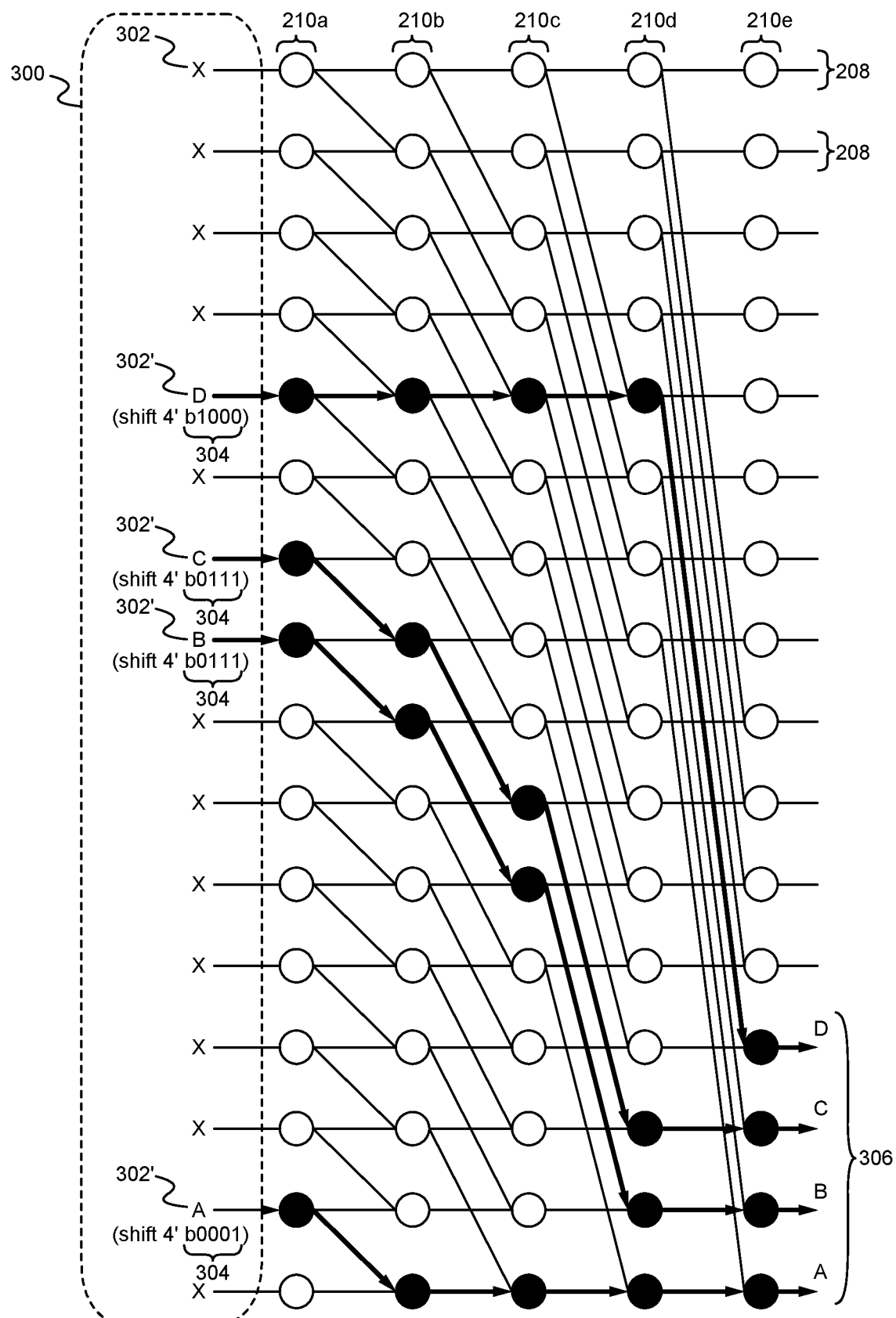
FIG. 3 illustrates a barrel compactor compacting an exemplary dataset according to some embodiments.

FIG. 3 illustrates a barrel compactor 102 compacting an exemplary input dataset 300 according to some embodiments. As shown in FIG. 3, the input dataset 300 comprises a plurality of data units 302, 302', wherein one or more of the data units 302' (A, B, C, D) are a part of a desired subset that needs to be extracted from the dataset 300. In other words, the a portion of the data units 302 (X) are able to have qualifier values (e.g. 0) that indicate that they are not a part of the desired subset and a remainder of the data units 302' (A, B, C, D) are able to have qualifier values (e.g. 1) that indicate that they are a part of the desired subset. The qualifier values are not shown in FIG. 3 for the sake of clarity. As also shown in FIG. 3, each of the data units 302' of the subset have corresponding shift values 304 that indicate how much the associated data unit 302' need to be shifted to be positioned within the subset group 306 of the modified output subset. Additionally, it should be noted that adjacent data units 302' (e.g. B and C) of the subset will have the same shift value 304 such that a single shift value is able to be calculated for one of the adjacent data units 302' and then that shift value is able to be assigned to all of the adjacent data units 302'. In some embodiments, the data units 302 that are not a part of the subset do not have shift values. Alternatively, the data units 302 that are not a part of the subset are able to have shift values that indicate to not shift the data unit 302.

Each of the shift values 304 is able to comprise a plurality of values (e.g. one value for each of the rows 210 including logic cells 204 that are able to selectively shift data units 302, 302') that individually indicate whether a shift should occur for cells 204 of different rows 210. For example, as shown in FIG. 3 each of the positions of the shift values 304 are associated with one of the rows 210. Thus, for the shift value of b0111, the first position (e.g. b0111) is able to correspond to the first shifting row 210a, the second position (e.g. b0111) is able to correspond to the second shifting row 210b and so on. As a result, each of the logic cells 204 of one of the rows 210 is able to either shift or pass the data unit 302, 302' based on the corresponding value of the shift value 304 (e.g. if =1 then shift, if =0 then pass). Each of the shift values 304 is able to comprise a single value (or a plurality of values, but less than the number of rows 210) wherein the same value or values are able to be used by a plurality of the rows 210 to determine if the data unit 302, 302' should be shifted. In any case, when combined with an understanding of the amount of columns 208 that each of the rows 210 is configured to shift a data unit 302, 302', the compactor 102 and/or shift generator 104 is/are able to generate shift values 304 that shift the data units 302, 302' a desired total amount of columns 208 once they traverse the entire array 202.

In operation in the example shown in FIG. 3, the input dataset 302 is input by the columns 208 of the barrel compactor 102 in parallel and upon receipt by the logic cells 204 of the first row 210a, the logic cells 204 receiving data units 302' A, B and C determine that a shift is needed based on the first position of the corresponding shift values 304 whereas the logic cell 204 receiving data unit 302' D (and the logic cells 204 receiving the other data units 302) determines that a shift is not needed. Thus, data units 302' A, B and C are output on shifting lines to different columns 208 of the next row 210b and the data unit 302' D (and the logic cells 204 receiving the other data units 302) is output on the pass line to the logic cell 204 of the next row 210b of the same column 208. Further, it should be noted that along with the data of the data units 302, 302', the associated shift values 304 and/or qualifier values are also able to be output on the shift or pass lines 206a, 206b. As a result, the logic cells 204 of row 210b that receive the data units 302' A, B and C from the incoming shift line also receive a data unit 302 from the incoming pass line during that cycle.

In some embodiments, upon receiving two data units 302, 302' during the same cycle, the logic cells 204 always discard the data unit 302 from the incoming pass line 206a and selects the data unit 302' from the incoming shift line 206b to output (based on the corresponding shift value 304). Indeed, in such embodiments the qualifier values (not shown) are able to be omitted and/or not transmitted with the data units 302, 302' through the array 202. Alternatively, if one of the data units 302' is a part of the subset and the other one of the data units 302 is not a part of the subset (e.g. as indicated by the corresponding qualifier values), the logic cell 204 is able to discard the data unit 302 that is not a part of the subset and select the data unit 302' (e.g. A, B and C) that is a part of the subset. In some embodiments, as shown in FIG. 4 below, if both of the received data units 302' are a part of the subset (e.g. as indicated by the corresponding qualifier values), the logic cell 204 is able to perform a predetermined logical function that combines the data of the two data units 302' thereby creating a single modified data unit that is output by the logic cell 204.

In any case, the process then repeats for the logic cells 204 of the second row 210b, wherein in this case the shift values 304 indicate that data units 302' B and C need to be output on the shift lines 206b whereas data units 302' A and D (and the logic cells 204 receiving the other data units 302) need to be output on the pass lines 206a. Subsequently, after all of the logic cells 204 of all of the rows 210 of the array 202 have completed the process the resulting output will include all of the data units 302' of the subset repositioned adjacent to each other in a group 306 at one end of the array 202 (and/or modified output dataset). Therefore, the compactor 102 provides the advantages of cheaply enabling the extraction of desired subsets of input datasets 300 and enabling each of the data units 302, 302' to have a unit shift value 304 and thus be shifted uniquely to any of the other data units 302, 302'. In some embodiments, this group 306 is able to include one or more zeros in columns 208/positions between one or more of the data units 302' of the subset based on the configuration of the barrel compactor 102 and/or the shift generator 104. For example, as described above, if the shift values of one or more of the data units 302' (e.g. B, C and D) are configured to shift the data units 302' one less column 208/position, the result will be a zero in the second column 208 of the group 306 between the data unit 302' A and the data units 302' B, C and D. Thus, the compactor 102 provides the advantage of enabling portions of the subset to be distinguished from each other (e.g. a buffer between a flag and a remainder of the subset) while still grouping the subset as a whole into an adjacent group (including the added zeros) within the modified output dataset.

Figure 4:
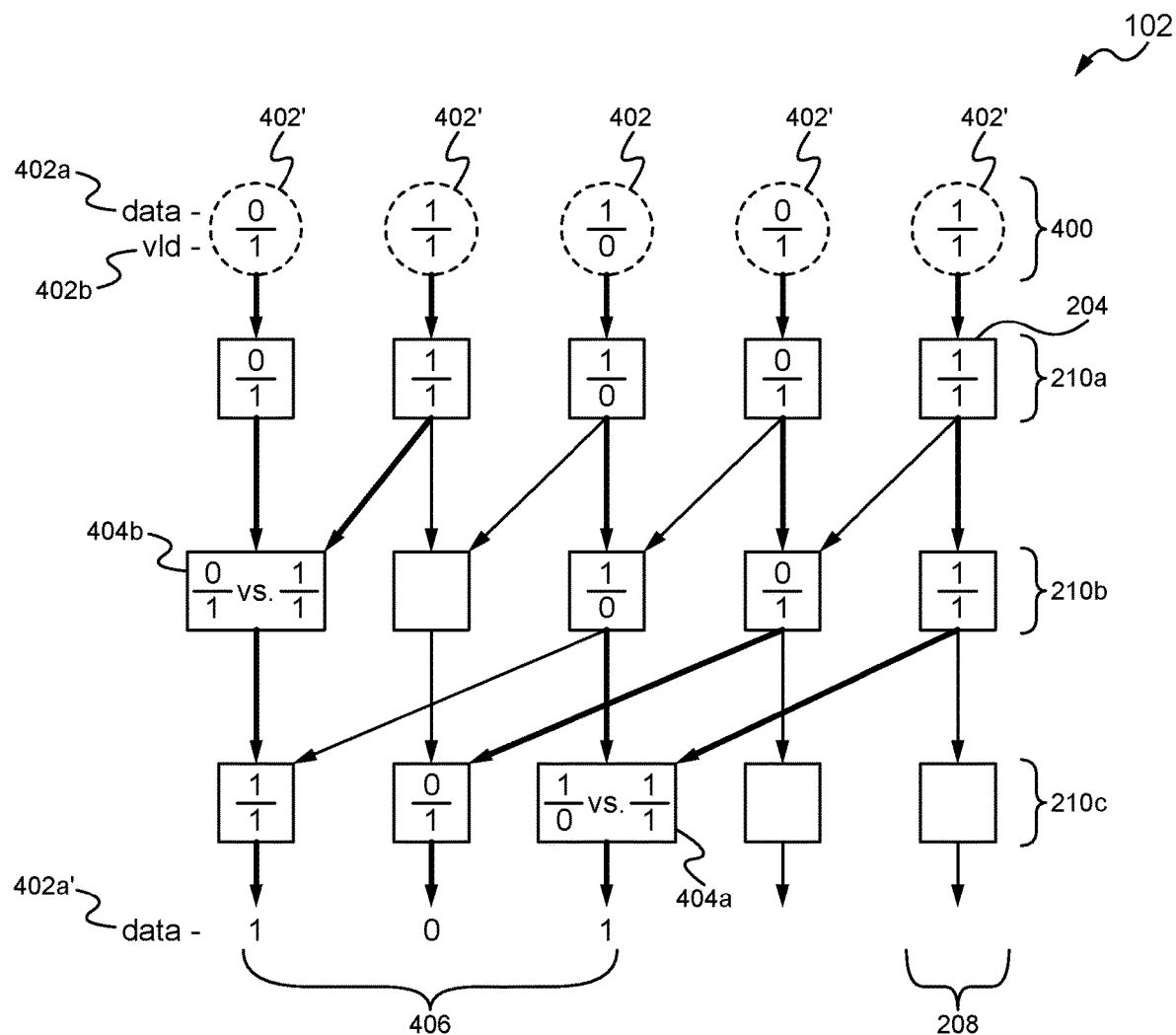
FIG. 4 illustrates a barrel compactor including cell combination logic and compacting an exemplary dataset according to some embodiments.

FIG. 4 illustrates a barrel compactor 102 including cell combination logic and compacting an exemplary dataset 400 of data units 402' that are a part of a desired subset and data units 402 that are not a part of the subset according to some embodiments. In particular, the barrel compactor 102 of FIG. 4 is able to be substantially similar to the barrel compactor 102 of FIG. 3, except that one or more of the logic cells 204 are able to include one or more logical combination elements that are able to logically combine the data 402*a* of from two data units 402, 402' received at the logic cell 204 during the same cycle. In some embodiments, all of the logic cells 204 of the array 202 have the same logical combination elements such that they all are able to perform the same logical combination functions between the data 402*a* of two input data units 402, 402'. Alternatively, one or more of the logic cells 204 are able to have no logical combination elements or different logical combination elements that perform different logical combination functions between the data 402*a* of two input data units 402, 402'. The logical functions performed by the logical combination elements are able to be an XOR function, an AND function, an OR function, a NOR function, a NAND function, other logic design functions known in the art, and/or combinations of these functions.

In operation, each of the data units 402, 402' of the input dataset 400 follow the bold paths through the array 202 based on their corresponding shift values (not shown) wherein the numerator of the values within each cell 204 indicate the data value 402*a* of the data unit 402, 402' and the denominator of the values indicate the qualifier value 402*b* of the data unit 402, 402' input and output by that logic cell 204. As shown in FIG. 4, most of the logic cells 204 only receive a single data unit 402, 402' during a cycle. However, two of the logic cells 404*a*, and 404*b* receive two data units 402, 402' during the same cycle. As a result, these logic cells 404 are able to selectively utilize their logical combination elements to combine the data 402*a* of the two received data units 402, 402' and thereby create a single combined data of a combined data unit to output. Alternatively, these logic cells 404 are able to forgo use of their logical combination elements and instead select one or neither of the input data units 402, 402' for output in the same manner as described above in FIG. 3. In some embodiments, the logic cells 404 determine whether to use their logical combination elements based on the qualifier values 402*b* of the input data units 402, 402'. Alternatively, the logic cells 404 are able to determine whether to use their logical combination elements based on the qualifier values 402*b* of the input data units 402, 402', the data values 402*a* of the input data units 402, 402', the shift values of the input data units 402, 402' or a combination thereof.

For example, as shown in FIG. 4, the logic cells 404 only use their logical combination elements if both of the qualifier values 402*b* indicate that both the first data unit 402' and the second data unit 402' are a part of the subset. Thus, in logic cell 404*a*, the combination function is not performed because only one of the data units 402' is a part of the subset (as indicated by the qualifier values 402*b*). Instead, the logic cell 404*a* selects the data unit 402' that is a part of the subset and/or that was received from the incoming shift line 206*b*. In contrast, the logic cell 404*b* performs the logical combination function with the logical combination elements because the two qualifier values 402*b* indicate that the two received data units 402' are both a part of the subset. Therefore, if the logical combination function is an XOR function, the logic cell 404*b* will XOR the data value 0 with the data value 1 of the two data units 402' which results in a combined data value of 1. As a result, the logic cell 404*b* outputs a modified data unit 402' having a data value 402*a* equal to 1 down the pass line (or shift line) based one or more of the shift values of the two data units 402'.

Figure 5:
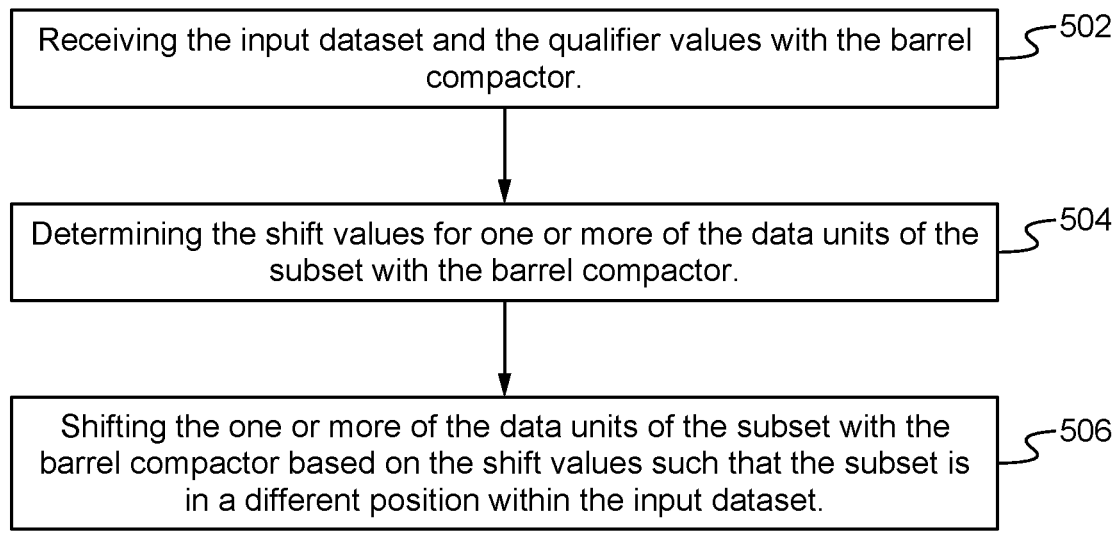
FIG. 5 illustrates a method of operating a packet processing system on a packet processing device according to some embodiments.

In some embodiments, the logic cell 404*b* is able to select one of the two shift values (not shown) and/or one of the two qualifier values 402*b* to determine which line to send the modified data unit on and to send along with the modified data unit, or is able to combine the shift values and/or qualifier values 402*b* into a modified shift value and/or qualifier value to determine which line to send the modified data unit on and to be sent along with the modified data unit. Therefore, the compactor 102 provides the advantage of selectively performing desired combinatorial logic with one or more pairs of the data units 402, 402' and/or results from prior combinations of data units (e.g. previously created modified data units) thereby providing increased processing power in addition to the data extraction. It should be noted, as described above, although the data 402*a* of the data units 402, 402' of FIG. 4 is a single bit, the data 402*a* is able to comprise a plurality of bits, bytes, words or any other denomination or group of data. Additionally, in some embodiments the combination function is able to be performed on the two shift values in addition to or in lieu of performing the function on the data values 402*a*. Further, FIG. 5 illustrates a method of operating a packet processing system on a packet processing device according to some embodiments. As shown in FIG. 5, the barrel compactor 102 receives the input dataset and the qualifier values at the step 502. For example, the barrel compactor 102 is able to receive the input dataset by inputting a different one of the data units with each of the columns 208 such that the input dataset is received by the array 202 in parallel. In some embodiments, the qualifier values and/or the input dataset are received from the qualifier generator 106. In some embodiments, the qualifier values and/or the input dataset are able to be received along with the shift values from the shift generator 104. The barrel compactor 102 identifies the shift values for one or more of the data units of the subset at the step 504. In some embodiments, the shift values are received from the shift generator 104. Alternatively, the shift generator 104 is able to be incorporated in to the barrel compactor 102. The barrel compactor 102 shifts the one or more of the data units of the subset based on the shift values such that the subset is in a different position within the input dataset at the step 504. For example, as one of the data units is received by one of the logic cells 204 within the array 202, the logic cell 204 is able to shift the data unit (and the associated qualifier and shift values) down the shift line if the shift value indicates that the logic cell 204 (or row 210 in which the logic cell 204 resides) should shift the data unit. Otherwise, the logic cell 204 is able to simply pass the data unit (and the associated qualifier and shift values) down the pass line out of the compactor 102 or to the next logic cell 204 within the array 202. As a result, the method provides the benefit of extracting the desired subset into a single group within the input dataset such that the subset is able to be easily removed and used for further processing.

In some embodiments, the subset is shifted such that all of the data units of the subset are adjacent to each other (e.g. at the rightmost or leftmost positions of the input dataset). In some embodiments, the shifting includes the transmitting of the corresponding shift value and the qualifier values with each of the data units as they are passed or shifted through the array 202. As a result, the method provides the advantage of enabling each of the data units to have a unit shift value and thus be shifted uniquely to any of the other data units. In some embodiments, if a logic cell 204 receives two data units during the same cycle, the logic cell 204 always discards the data unit from the incoming pass line 206*a* and selects the data unit from the incoming shift line 206*b*. Alternatively, if one of the data units is a part of the subset and the other one of the data units is not a part of the subset (e.g. as indicated by the corresponding qualifier values), the logic cell 204 is able to discard the data unit that is not a part of the subset and select the data unit that is a part of the subset. In some embodiments, if both of the received data units are a part of the subset (e.g. as indicated by the corresponding qualifier values), the logic cell 204 is able to perform a predetermined logical function that combines the data of the two data units (thereby creating a single modified data units). In such embodiments, the logic cell 204 is able to select one of the shift values and qualifier to send along with the modified data unit or is able to combine the shift values into a modified shift value to be sent along with the modified data unit and the selected qualifier value. As a result, the method provides the advantage of selectively performing desired combinatorial logic with one or more pairs of the data units and/or results from prior combinations of data units thereby providing increased processing power in addition to the data extraction.

Additionally, in some embodiments the method further comprises the barrel compactor 102 inserting one or more zeros in a location between one or more of the data units of the subset as organized in the different position. Specifically, the barrel compactor 102 is able to modify the shift values by reducing the shift values of all of the data units to either the right or the left of the location by the desired number of zeros. Thus, the method provides the advantage of enabling portions of the subset to be distinguished from each other (e.g. a buffer between a flag and a remainder of the subset) while still grouping the subset as a whole into an adjacent group (including the added zeros) within the modified output dataset. In some embodiments, the method further comprises the barrel compactor 102 and/or the shift generator 104 automatically generating the shift values based on the input dataset and the qualifier values. For example, the barrel compactor 102 and/or shift generator 104 is/are able to use the qualifier values to identify the data units that are a part of the subset, calculating a first number of the data units that are between one side of the input dataset and a closest one of the data units of the subset to the one side, and for each gap between one of the data units of the subset and a next of the data units of the subset, calculating a gap size that is equal to a number of the data units within the gap. As a result, the barrel compactor 102 and/or shift generator 104 is/are able to determine the shift value of each of the data units of the subset as the summation of the first number and the gap size of each of the gaps between the data unit and the one side of the input dataset. Thus, the method provides the advantage of not requiring shift values be supplied to the barrel compactor 102 and/or shift generator 104.

The packet processing system, method and device described herein has numerous advantages. In particular, the system, method and device provides the advantage of extracting the desired subset into a single group within the input dataset such that the subset is able to be easily removed and used for further processing. Further, the system, method and device provides the advantage of selectively performing desired combinatorial logic with one or more pairs of the data units and/or results from prior combinations of data units thereby providing increased processing power in addition to the data extraction. Moreover, the system, method and device provides the advantage of enabling portions of the subset to be distinguished from each other (e.g. a buffer between a flag and a remainder of the subset) while still grouping the subset as a whole into an adjacent group (including the added zeros) within the modified output dataset. Additionally, the system method and device provide the advantage of enabling each of the data units to have a unit shift value and thus be shifted uniquely to any of the other data units.

While the invention has been described with reference to numerous specific details, one of ordinary skill in the art will recognize that the invention can be embodied in other specific forms without departing from the spirit of the invention. For example, although the different methods and operations described herein describe a particular order of steps, other orders are contemplated as well as the omission of one or more of the steps and/or the addition of one or more new steps. Moreover, although the methods and operations above are described herein separately, one or more of the methods and operations are able to be combined (in whole or part). Thus, one of ordinary skill in the art will understand that the invention is not to be limited by the foregoing illustrative details, but rather is to be defined by the appended claims.

We claim:

1. A barrel compactor system for extracting a subset of data from a plurality of data units that together form an input dataset, the system comprising:
   a data subset identifier that generates a qualifier value for each of the data units of the input dataset; and
   a barrel compactor comprising an array of a plurality of logic cells that are each associated with a logical function, wherein the barrel compactor performs the logical function of one or more of the logic cells on the input dataset based on the qualifier values of the data units.

2. The system of claim 1, wherein the barrel compactor shifts one or more of the data units of the subset such that the subset is in a different position within the input dataset, and further wherein when in the different position within the input dataset, all of the data units of the subset are adjacent to each other.

3. The system of claim 2, wherein when in the different position within the input dataset, a rightmost data unit of the subset is in a rightmost position of the input dataset or a leftmost data unit of the subset is in a leftmost position of the input dataset.

4. The system of claim 2, wherein for one or more rows of one or more columns of the array, each of the logic cells of the one or more rows of the one or more columns is coupled with the logic cell of the next row of a different one of the columns via a data shift line.

5. The system of claim 4, wherein the different one of the columns is a predetermined number of columns away from the column including the logic cell of the one or more rows of the one or more columns.

6. The system of claim 5, wherein the predetermined number of columns away is the same for all of the logic cells in the same one of the rows.

7. The system of claim 6, wherein the barrel compactor receives the input dataset by inputting a different one of the data units with each of the columns such that the input dataset is received by the array in parallel.

8. The system of claim 7, wherein upon receiving one of the data units and a shift value during a cycle, each of the logic cells:
   transmit the data unit and the shift value to the next logic cell of the column if the shift value does not indicate a shift is necessary by the row that the logic cell is a part of; and
   transmit the data unit and the shift value to the logic cell of the next row of the different one of the columns if the shift value indicates that a shift is necessary by the row that the logic cell is a part of.

9. The system of claim 4, wherein the qualifier value indicates if the data unit is a part of the subset.

10. The system of claim 9, wherein upon receiving two of the data units and two shift values during the same cycle, each of the logic cells:
  discard one of the two data units and one of the two shift values; and
  select another of the two data units and another of the two shift values received from the one of the shift lines for transmission.

11. The system of claim 9, wherein upon receiving two of the data units, two shift values and two qualifier values during the same cycle, each of the logic cells:
  discard one of the two data units, one of the two shift values and one of the two qualifier values if the one of the two qualifier values indicates that the one of the two data units is not a part of the subset;
  discard another of the two data units, another of the two shift values and another of the two qualifier values if the another of the two qualifier values indicates that the another of the two data units is not a part of the subset;
  if the one of the two qualifier values indicates that the one of the two data units is a part of the subset, select the one of the two data units, the one of the two shift values and the one of the two qualifier values for transmission; and
  if the another of the two qualifier values indicates that the another of the two data units is a part of the subset, select the another of the two data units, the another of the two shift values and the another of the two qualifier values for transmission.

12. The system of claim 2, wherein a data shift unit generator inserts a zero in a location between one or more of the data units of the subset as organized in the different position by reducing the shift values of all of the data units to either the right or the left of the location by one.

13. The system of claim 1, wherein each of the logic cells comprise a multiplexor.

14. The system of claim 2, wherein a data unit shift generator generates a shift value for each of the data units of the subset based on the qualifier values of the plurality of data units.

15. The system of claim 14, wherein the data unit shift generator generates the shift value for each of the data units of the subset based on the qualifier values of the plurality of data units by:
  using the qualifier values to identify the data units that are a part of the subset;
  calculating a first number of the data units that are between one side of the input dataset and a closest one of the data units of the subset to the one side; and
  for each gap between one of the data units of the subset and a next of the data units of the subset, calculating a gap size that is equal to a number of the data units within the gap.

16. The system of claim 15, wherein the data unit shift generator determines the shift value of each of the data units of the subset by summing the first number and the gap size of each of the gaps between the data unit and the one side of the input dataset.

17. The system of claim 1, wherein each of the data units is selected from the group consisting of a bit, a byte or a word.

18. The system of claim 4, wherein, for each of the rows of the array, each of a plurality of shift values indicate whether a shift is necessary for the row.

19. A barrel compactor for extracting a subset of data from a plurality of data units that together form an input dataset, wherein each of the data units is associated with a qualifier value, the barrel compactor comprising an array of a plurality of logic cells that are each associated with a logical function, wherein the barrel compactor performs the logical function of one or more of the logic cells on one or more data units of the input dataset based on qualifier values of the data units, wherein the one or more logic cells comprise a multiplexor.

20. The barrel compactor of claim 19, wherein the barrel compactor shifts one or more of the data units of the subset such that the subset is in a different position within the input dataset, and further wherein when in the different position within the input dataset, all of the data units of the subset are adjacent to each other.

21. The barrel compactor of claim 20, wherein when in the different position within the input dataset, a rightmost data unit of the subset is in a rightmost position of the input dataset or a leftmost data unit of the subset is in a leftmost position of the input dataset.

22. The barrel compactor of claim 20, wherein for one or more rows of one or more columns of the array, each of the logic cells of the one or more rows of the one or more columns is coupled with the logic cell of the next row of a different one of the columns via a data shift line.

23. The barrel compactor of claim 22, wherein the different one of the columns is a predetermined number of columns away from the column including the logic cell of the one or more rows of the one or more columns.

24. The barrel compactor of claim 23, wherein the predetermined number of columns away is the same for all of the logic cells in the same one of the rows.

25. The barrel compactor of claim 24, wherein the barrel compactor receives the input dataset by inputting a different one of the data units with each of the columns such that the input dataset is received by the array in parallel.

26. The barrel compactor of claim 25, wherein upon receiving one of the data units and a shift value during a cycle, each of the logic cells:
  transmit the data unit and the shift value to the next logic cell of the column if the shift value does not indicate a shift is necessary by the row that the logic cell is a part of; and
  transmit the data unit and the shift value to the logic cell of the next row of the different one of the columns if the shift value indicates that a shift is necessary by the row that the logic cell is a part of.

27. The barrel compactor of claim 22, wherein each qualifier value of the qualifier values indicates if the data unit associated with the qualifier value is a part of the subset.

28. The barrel compactor of claim 27, wherein each of the qualifier values is transmitted by the logic cells through the array along with the associated one of the data units.

29. The barrel compactor of claim 27, wherein upon receiving two of the data units and two shift values during the same cycle, each of the logic cells:
  discard one of the two data units and one of the two shift values; and
  select another of the two data units and another of the two shift values received from the one of the shift lines for transmission.

30. The barrel compactor of claim 27, wherein upon receiving two of the data units, two shift values and two qualifier values during the same cycle, each of the logic cells:
  discard one of the two data units, one of the two shift values and one of the two qualifier values if the one of the two qualifier values indicates that the one of the two data units is not a part of the subset;

discard another of the two data units, another of the two shift values and another of the two qualifier values if the another of the two qualifier values indicates that the another of the two data units is not a part of the subset;

if the one of the two qualifier values indicates that the one of the two data units is a part of the subset, select the one of the two data units, the one of the two shift values and the one of the two qualifier values for transmission; and if the another of the two qualifier values indicates that the another of the two data units is a part of the subset, select the another of the two data units, the another of the two shift values and the another of the two qualifier values for transmission.

31. The barrel compactor of claim 20, wherein the barrel compactor inserts a zero in a location between one or more of the data units of the subset as organized in the different position by reducing the shift values of all of the data units to either the right or the left of the location by one.

32. The barrel compactor of claim 20, wherein the barrel compactor generates a shift value for each of the data units of the subset based on the qualifier values of the plurality of data units.

33. The barrel compactor of claim 32, wherein the barrel compactor generates the shift value for each of the data units of the subset based on the qualifier values of the plurality of data units by:

using the qualifier values to identify the data units that are a part of the subset;

calculating a first number of the data units that are between one side of the input dataset and a closest one of the data units of the subset to the one side; and for each gap between one of the data units of the subset and a next of the data units of the subset, calculating a gap size that is equal to a number of the data units within the gap.

34. The barrel compactor of claim 33, wherein the barrel compactor determines the shift value of each of the data units of the subset by summing the first number and the gap size of each of the gaps between the data unit and the one side of the input dataset.

35. The barrel compactor of claim 19, wherein each of the data units is selected from the group consisting of a bit, a byte or a word.

36. The barrel compactor of claim 22, wherein, for each of the rows of the array, each of a plurality of shift values indicate whether a shift is necessary for the row.

37. A method of extracting a subset of data from a plurality of data units that together form an input dataset, the method comprising:

generating a qualifier value for each of the data units of the input dataset with a data subset identifier; and with a barrel compactor comprising an array of a plurality of logic cells that are each associated with a logical function, performing the logical function of one or more of the logic cells on the input dataset based on the qualifier values of the data units.

38. The method of claim 37, further comprising shifting one or more of the data units of the subset with the barrel compactor such that the subset is in a different position within the input dataset, wherein when in the different position within the input dataset, all of the data units of the subset are adjacent to each other.

39. The method of claim 38, wherein when in the different position within the input dataset, a rightmost data unit of the subset is in a rightmost position of the input dataset or a leftmost data unit of the subset is in a leftmost position of the input dataset.

40. The method of claim 38, wherein for one or more rows of one or more columns of the array, each of the logic cells of the one or more rows of the one or more columns is coupled with the logic cell of the next row of a different one of the columns via a data shift line.

41. The method of claim 40, wherein the different one of the columns is a predetermined number of columns away from the column including the logic cell of the one or more rows of the one or more columns.

42. The method of claim 41, wherein the predetermined number of columns away is the same for all of the logic cells in the same one of the rows.

43. The method of claim 42, wherein the barrel compactor receives the input dataset by inputting a different one of the data units with each of the columns such that the input dataset is received by the array in parallel.

44. The method of claim 43, further comprising, for each of the logic cells, upon receiving one of the data units and a shift value during a cycle:

transmitting with the logic cell the data unit and the shift value to the next logic cell of the column if the shift value does not indicate a shift is necessary by the row that the logic cell is a part of; and transmitting with the logic cell the data unit and the shift value to the logic cell of the next row of the different one of the columns if the shift value indicates that a shift is necessary by the row that the logic cell is a part of.

45. The method of claim 40, wherein each qualifier value of the qualifier values indicates if the data unit associated with the qualifier value is a part of the subset.

46. The method of claim 45, wherein each of the qualifier values is transmitted by the logic cells through the array along with the associated one of the data units.

47. The method of claim 45, further comprising, with each of the logic cells, upon receiving two of the data units and two shift values during the same cycle:

discarding with the logic cell one of the two data units and one of the two shift values; and selecting with the logic cell another of the two data units and another of the two shift values received from the one of the shift lines for transmission.

48. The method of claim 45, further comprising, for each of the logic cells, upon receiving two of the data units, two shift values and two qualifier values during the same cycle:

discarding with the logic cell one of the two data units, one of the two shift values and one of the two qualifier values if the one of the two qualifier values indicates that the one of the two data units is not a part of the subset;

discarding with the logic cell another of the two data units, another of the two shift values and another of the two qualifier values if the another of the two qualifier values indicates that the another of the two data units is not a part of the subset;

if the one of the two qualifier values indicates that the one of the two data units is a part of the subset, selecting with the logic cell the one of the two data units, the one of the two shift values and the one of the two qualifier values for transmission; and if the another of the two qualifier values indicates that the another of the two data units is a part of the subset, selecting with the logic cell the another of the two data units, the another of the two shift values and the another of the two qualifier values for transmission.

49. The method of claim 38, further comprising inserting with the barrel compactor a zero in a location between one or more of the data units of the subset as organized in the different position by reducing shift values of all of the data units to either the right or the left of the location by one.

50. The method of claim 49, wherein each of the logic cells comprise a multiplexor.

51. The method of claim 38, further comprising generating a shift value for each of the data units of the subset with the barrel compactor based on the qualifier values of the plurality of data units.

52. The method of claim 51, wherein the barrel compactor generates the shift value for each of the data units of the subset based on the qualifier values of the plurality of data units by:
  using the qualifier values to identify the data units that are a part of the subset;
  calculating a first number of the data units that are between one side of the input dataset and a closest one of the data units of the subset to the one side; and
  for each gap between one of the data units of the subset and a next of the data units of the subset, calculating a gap size that is equal to a number of the data units within the gap.

53. The method of claim 52, wherein the barrel compactor determines the shift value of each of the data units of the subset by summing the first number and the gap size of each of the gaps between the data unit and the one side of the input dataset.

54. The method of claim 37, wherein each of the data units is selected from the group consisting of a bit, a byte or a word.

55. The method of claim 40, wherein, for each of the rows of the array, each of a plurality of shift values indicate whether a shift is necessary for the row.

* * * * *